US012575368B2

(12) United States Patent
Seyama et al.

(10) Patent No.: US 12,575,368 B2
(45) Date of Patent: Mar. 10, 2026

(54) APPARATUS FOR PRODUCING SEMICONDUCTOR DEVICE, AND METHOD FOR PRODUCING SEMICONDUCTOR DEVICE

(71) Applicant: Yamaha Robotics Co., Ltd., Tokyo (JP)

(72) Inventors: Kohei Seyama, Tokyo (JP); Makoto Takahashi, Tokyo (JP)

(73) Assignee: Yamaha Robotics Co., Ltd., Tokyo (JP)

( * ) Notice: Subject to any disclaimer, the term of this patent is extended or adjusted under 35 U.S.C. 154(b) by 1159 days.

(21) Appl. No.: 17/609,401

(22) PCT Filed: Nov. 10, 2020

(86) PCT No.: PCT/JP2020/041939
§ 371 (c)(1),
(2) Date: Nov. 7, 2021

(87) PCT Pub. No.: WO2021/124732
PCT Pub. Date: Jun. 24, 2021

(65) Prior Publication Data
US 2022/0223450 A1     Jul. 14, 2022

(30) Foreign Application Priority Data

Dec. 17, 2019    (JP) ................................. 2019-227360

(51) Int. Cl.
*H01L 21/68* (2006.01)
*H01L 21/67* (2006.01)
(Continued)

(52) U.S. Cl.
CPC ...... *H01L 21/681* (2013.01); *H01L 21/67144* (2013.01); *H01L 21/67259* (2013.01);
(Continued)

(58) Field of Classification Search
CPC ............. H01L 21/67144; H01L 21/681; H01L 21/67259; H01L 21/50; H01L 21/68; H01L 21/74; H01L 21/80; H05K 3/0812
See application file for complete search history.

(56) References Cited

U.S. PATENT DOCUMENTS 6,735,856 B1 * 5/2004 Kitamura ........... H05K 13/0812
29/721
8,540,001 B2 9/2013 Kihara et al.
(Continued)

FOREIGN PATENT DOCUMENTS

JP       2004146776       5/2004
JP       2012174755       9/2012
(Continued)

OTHER PUBLICATIONS

Huang et al, "Fabrication Study of a LED Thermosonic Flip Chip Bonding Apparatus," 2007 IEEE International Conference on Mechatronics, Kumamoto, Japan, 2007, pp. 1-4. (Year: 2007).*
(Continued)

*Primary Examiner* — A. Dexter Tugbang
(74) *Attorney, Agent, or Firm* — JCIPRNET

(57) ABSTRACT

An apparatus for producing a semiconductor device comprises a stage, a bonding head, a bonding tool and a first camera that are attached to the bonding head, and a controller, the apparatus moreover being such that the controller is configured to execute for each of one or more points: a process of mounting an inspection chip on a mounting surface; a process of acquiring, as an inspection image, an image of the mounting surface after the inspection chip has been mounted thereon captured by the first camera; a process of calculating, as an area correction amount C, a correction amount for a camera offset amount Ocm on the basis of the position of the inspection chip in the inspection image; and a process of associating the calculated area image; and a process of associating the calculated area (Continued)

correction amount C and the position of a discretionary point and then storing the associated information in a storage device.

8 Claims, 13 Drawing Sheets

(51) Int. Cl.
| | |
|---|---|
| *H01L 23/00* | (2006.01) |
| *H01L 21/50* | (2006.01) |
| *H05K 13/08* | (2006.01) |

(52) U.S. Cl.
CPC .............. *H01L 24/80* (2013.01); *H01L 21/50* (2013.01); *H01L 21/68* (2013.01); *H01L 24/74* (2013.01); *H05K 13/0812* (2018.08)

(56) References Cited

U.S. PATENT DOCUMENTS

| | | | |
|---|---|---|---|
| 10,068,872 B2 | 9/2018 | Takahashi et al. | |
| 10,288,413 B2 | 5/2019 | Bilewicz et al. | |
| 2006/0174480 A1 * | 8/2006 | Kawada | H01L 21/67144 |
| | | | 29/832 |
| 2017/0148759 A1 | 5/2017 | Hayata et al. | |
| 2019/0304852 A1 | 10/2019 | Seyama | |

FOREIGN PATENT DOCUMENTS

| | | | |
|---|---|---|---|
| JP | 2017069554 | | 4/2017 |
| JP | 2017183616 A | * | 10/2017 |
| JP | 6256486 | | 1/2018 |
| WO | 2015170645 | | 11/2015 |

OTHER PUBLICATIONS

Machine Translation of WO 2015/170645, Mar. 2025. (Year: 2025).*
Office Action of Taiwan Counterpart Application, with partial English translation thereof, issued on Dec. 13, 2021, pp. 1-7.
"International Search Report (Form PCT/ISA/210) of PCT/JP2020/041939," mailed on Feb. 9, 2021, with English translation thereof, pp. 1-4.

* cited by examiner

APPARATUS FOR PRODUCING SEMICONDUCTOR DEVICE, AND METHOD FOR PRODUCING SEMICONDUCTOR DEVICE

CROSS-REFERENCE TO RELATED APPLICATION

This application is a 371 application of the International PCT application serial no. PCT/JP2020/041939, filed on Nov. 10, 2020, which claims the priority benefits of Japan Patent Application No. 2019-227360, filed on Dec. 17, 2019. The entirety of each of the above-mentioned patent applications is hereby incorporated by reference herein and made a part of this specification.

TECHNICAL FIELD

The present specification discloses an apparatus for producing a semiconductor device and a method for producing a semiconductor device in which a semiconductor device is produced with a semiconductor chip installed on a substrate.

DESCRIPTION OF RELATED ART

In the related art, a technique for installing a semiconductor chip on a substrate to produce a semiconductor device is widely known. In such a technique for producing a semiconductor device, it is required to reliably install a semiconductor chip at a target position. Therefore, a technique in which a bonding head is provided with a bonding tool for bonding a semiconductor chip and a camera for capturing an image of a substrate, a relative position of the bonding tool with respect to the substrate is determined on the basis of the image captured by the camera, and the semiconductor chip is installed at a target position is proposed in the related art.

According to such a technique, the semiconductor chip can be more reliably installed at the target position. Here, to accurately calculate the relative position of the bonding tool with respect to the substrate on the basis of the captured image, an accurate value of an offset amount between the bonding tool and the camera (hereinafter referred to as a "camera offset amount") is required. However, the camera offset amount often fluctuates due to distortion of a producing apparatus (particularly, distortion of a drive system of the bonding head), temperature change, or the like, and it is difficult to acquire an accurate value of the camera offset amount. As a result, in the related art, positional accuracy of the semiconductor chip may decrease.

REFERENCE LIST

Patent Literature

Patent Literature 1: Japanese Patent No. 6256486
Patent Literature 2: Japanese Patent Application Publication No. 2004-146776

SUMMARY

Technical Problem

Patent Literature 1 and Patent Literature 2 disclose a technique in which a two-vertical-field-of-view camera capable of simultaneously capturing images of both a chip held by a bonding tool and a substrate is provided, and on the basis of the images obtained by the two-vertical-field-of-view camera, a bonding head is driven such that an inspection chip is located at a target position of the substrate and a required correction amount is calculated from an actual position of the mounted chip.

According to Patent Literature 1 and Patent Literature 2, a position error of the chip can be reduced to some extent. However, Patent Literature 1 and Patent Literature 2 require an expensive two-vertical-field-of-view camera, which may lead to an increase in cost. Further, in Patent Literature 1, a dedicated substrate to which an alignment mark is attached is required for calculating the correction amount. Further, in Patent Literature 2, a procedure for calculating the correction amount is very complicated and takes time.

Therefore, the present specification discloses an apparatus for producing a semiconductor device and a method for producing a semiconductor device in which, when a semiconductor chip is installed, positional accuracy is further improved in a simpler procedure.

Solution to Problem

An apparatus for producing a semiconductor device disclosed in the present specification includes: a stage on which a substrate is mounted; a bonding head capable of moving to a discretionary point relative to the stage; a position detecting means for detecting a position of the bonding head; a bonding tool that is attached to the bonding head and holds a chip; a first camera that is attached to the bonding head and captures an image of a mounting surface, which is an upper surface of the stage or an upper surface of the substrate mounted on the stage, from above; and a controller, wherein the controller is configured to execute for each of one or more points: a mounting process of mounting the chip on the mounting surface by moving the bonding head to the discretionary point and then driving the bonding tool; an inspection image acquisition process of acquiring, as an inspection image, an image of the mounting surface after the chip has been mounted thereon captured by the first camera; a correction amount calculation process of calculating, as an area correction amount, a correction amount for a camera offset amount, which is an offset amount of the first camera with respect to the bonding tool, on the basis of a position of the chip in the inspection image; and a storage process of associating the calculated area correction amount and a position of the discretionary point detected by the position detecting means and then storing the associated information in a storage device.

In this case, in the correction amount calculation process, the controller may calculate the area correction amount on the basis of a difference between an actual position of the chip in the inspection image and an ideal position of the chip, which is obtained from the camera offset amount in design, in the inspection image.

Further, in this case, the apparatus for producing a semiconductor device may further include a second camera that captures an image of the bonding tool from below, the controller may be configured to execute a tool image acquisition process of acquiring, as a tool image, an image of the chip held by the bonding tool, which is captured by the second camera, prior to the mounting process, and the controller may calculate a chip offset amount which is an offset amount of a center of the bonding tool with respect to a center of the chip on the basis of the tool image, and may calculate the ideal position of the chip in the inspection image on the basis of the chip offset amount and the camera offset amount in design.

Further, after the mounting process is executed, the controller may execute the inspection image acquisition process without moving the bonding head horizontally.

Further, the position detecting means may include a position sensor installed in a drive system of the bonding head.

There is provided a method for producing a semiconductor device disclosed in the present specification in which steps are executed for each of one or more points, the steps including: a step of moving a bonding head, to which a bonding tool and a first camera are attached, to discretionary point on a stage; a step of mounting the chip held by the bonding tool on a mounting surface, which is an upper surface of the stage or an upper surface of the substrate mounted on the stage; a step of acquiring, as an inspection image, an image of the mounting surface after the chip has been mounted thereon captured by the first camera; a step of calculating, as an area correction amount, a correction amount for a camera offset amount, which is an offset amount of the first camera with respect to the bonding tool, on the basis of a position of the chip in the inspection image; and a step of associating the calculated area correction amount and a position of the discretionary point and then storing the associated information in a storage device.

Another apparatus for producing a semiconductor device disclosed in the present specification includes: a stage on which a substrate is mounted; a bonding head capable of moving relative to the stage; a bonding tool that is attached to the bonding head and bonds a chip to the substrate; a first camera that is attached to the bonding head and captures an image of a mounting surface, which is an upper surface of the stage or an upper surface of the substrate mounted on the stage, from above; and a controller, wherein the controller is configured to execute for each of one or more points: a first mounting process of mounting a reference chip on the mounting surface by moving the bonding head to a discretionary point and then driving the bonding tool; a reference image acquisition process of acquiring, as a reference image, an image of the mounting surface after the reference chip has been mounted thereon captured by the first camera; a second mounting process of mounting an inspection chip on the reference chip by positioning the bonding head on the basis of the reference image such that the inspection chip is allowed to be mounted directly above the reference chip and then driving the bonding tool; an inspection image acquisition process of acquiring, as an inspection image, an image of the mounting surface after the inspection chip has been mounted thereon captured by the first camera; a correction amount calculation process of calculating, as an area correction amount, a correction amount for a camera offset amount, which is an offset amount of the first camera with respect to the bonding tool, on the basis of a positional deviation between the reference chip and the inspection chip in the inspection image; and a storage process of associating the calculated area correction amount and a position of the discretionary point and then storing the associated information in a storage device.

Advantageous Effects of Invention

According to the apparatus for producing a semiconductor device and the method for producing a semiconductor device disclosed in the present specification, when a semiconductor chip is installed, positional accuracy is further improved in a simpler procedure.

DESCRIPTION OF THE EMBODIMENTS

Figure 1:
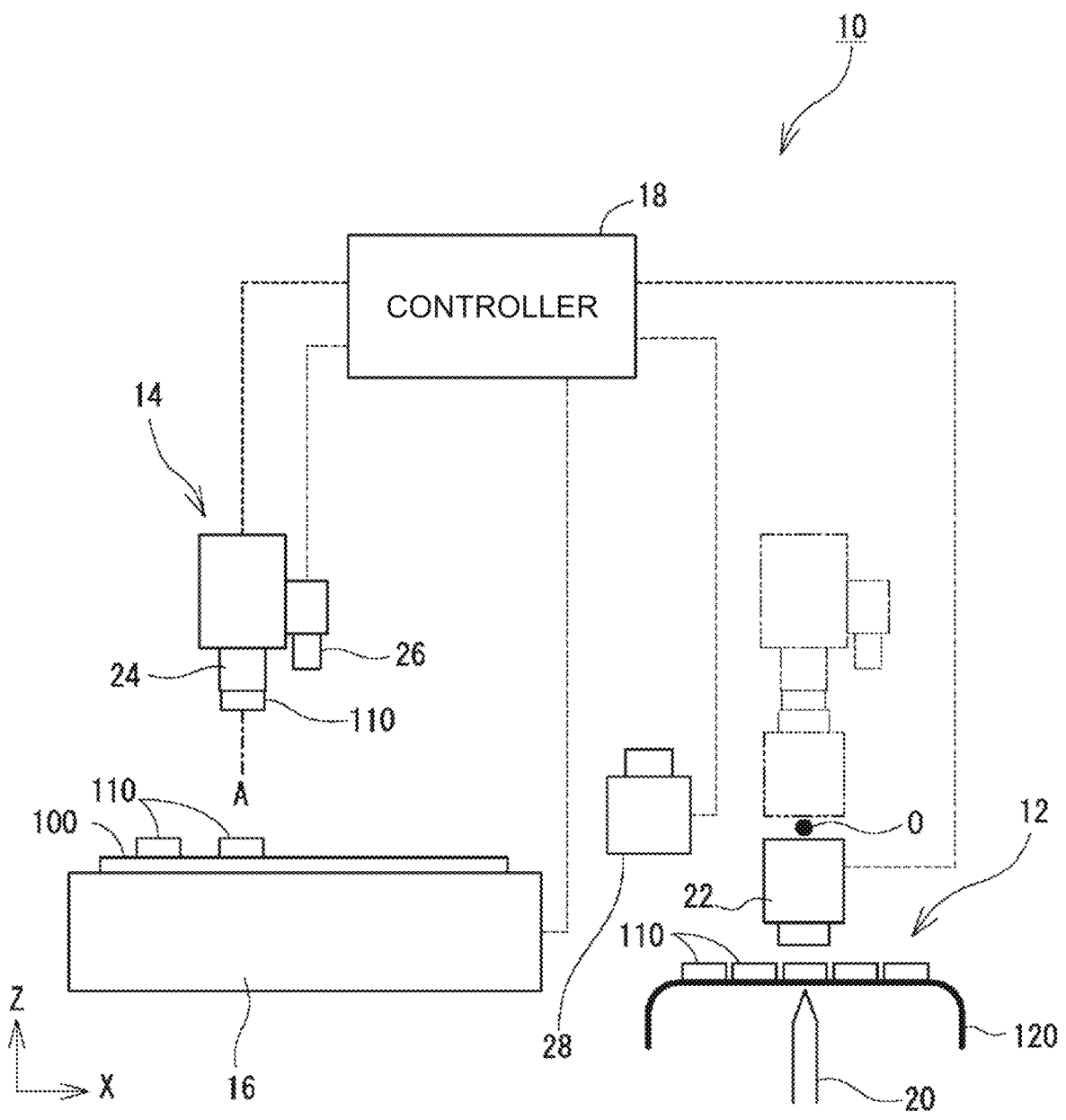
FIG. 1 is a schematic view showing a configuration of a producing apparatus.

Hereinafter, a configuration of an apparatus for producing a semiconductor device 10 will be described with reference to the drawings. FIG. 1 is a schematic view showing a configuration of the producing apparatus 10. The producing apparatus 10 produces a semiconductor device by bonding a plurality of semiconductor chips 110 to a substrate 100.

The producing apparatus 10 includes a pickup unit 12, a bonding head 14, a stage 16, and a controller 18. The pickup unit 12 has a push-up pin 20 that pushes up the semiconductor chip 110 mounted on a dicing tape 120, and a pickup head 22 that holds the pushed-up semiconductor chip 110 on its bottom surface. The pickup head 22 is rotatable about a rotation axis O extending in a horizontal direction. When the pickup head 22 rotates 180 degrees, the picked-up semiconductor chip 110 can be inverted 180 degrees in a thickness direction. As a result, the surface of the semiconductor chip 110 which is adhered to the dicing tape 120 faces upward.

The bonding head 14 is moved in the horizontal direction parallel to an upper surface of the stage 16 by an XY drive mechanism (not shown). The XY drive mechanism includes a drive source (a motor or the like) and a sensor that detects a moving position (for example, an encoder or the like). The bonding head 14 is provided with a bonding tool 24 that adsorbs and holds the semiconductor chip 110. The bonding tool 24 can be raised and lowered in a vertical direction orthogonal to the horizontal direction by a Z-axis drive mechanism (not shown) and can rotate around an axis A extending in the vertical direction.

Further, the bonding head 14 is also provided with a first camera 26. The first camera 26 is attached to the bonding head 14 in a posture in which an optical axis thereof extends downward and captures an image of the upper surface of the stage 16 or an upper surface of the substrate 100 mounted on the stage 16 (hereinafter referred to as a "mounting surface"). Since both the bonding tool 24 and the first camera 26 are fixed to the bonding head 14, they both move together with the bonding head 14.

An offset amount of the optical axis of the first camera 26 with respect to a central axis of the bonding tool 24 will be referred to below as a "camera offset amount Ocm." A value of the camera offset amount Ocm in design is stored in advance in a memory of the controller 18 as a basic camera offset amount Ocm_b. However, a slight error may occur between an actual camera offset amount Ocm and the basic camera offset amount Ocm_b due to distortion of a drive system, a temperature change, and the like. Therefore, in the present example, an area correction amount C for correcting the error between the actual camera offset amount Ocm and the basic camera offset amount Ocm_b is calculated prior to a bonding process of the semiconductor chip 110, which will be described later.

The stage 16 vacuum-adsorbs and supports the substrate 100 conveyed by a conveying mechanism (not shown). A second camera 28 disposed in a posture in which an optical axis thereof extends upward is provided in the vicinity of the stage 16. The second camera 28 captures an image of a bottom surface of the bonding tool 24 and the semiconductor chip 110 held by the bonding tool 24.

The controller 18 controls driving of each part of the producing apparatus 10 and includes, for example, a processor that executes various operations and a memory that stores various programs and data. The controller 18 drives the pickup unit 12 and the bonding head 14 to bond a plurality of semiconductor chips 110 onto the substrate 100. Further, in order to improve positional accuracy of the bonding, the controller 18 calculates the above-mentioned area correction amount C for each of a plurality of points Pi (i=1, 2, . . . , imax) and stores the calculated area correction amount C, which will be described later.

Figure 2:
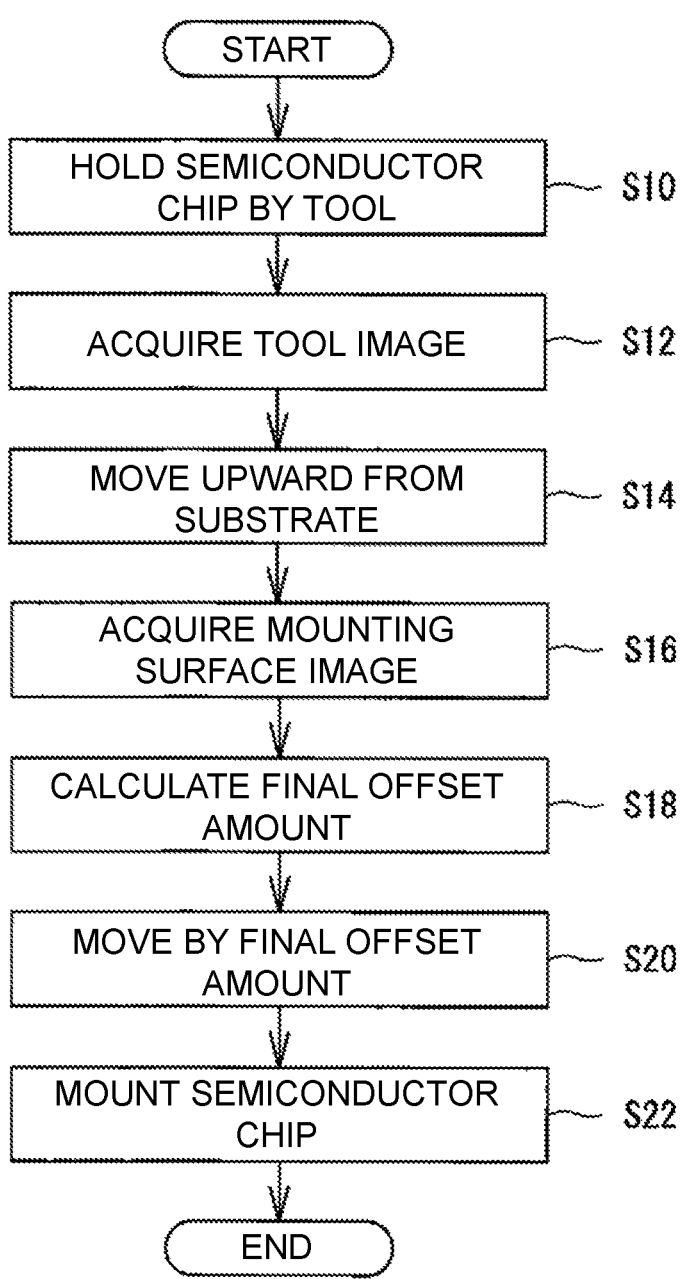
FIG. 2 is a flowchart showing a flow when a semiconductor chip is bonded to a target position on a substrate.

Next, a flow of bonding the semiconductor chip 110 to the target position on the substrate 100 will be described with reference to FIG. 2. When the semiconductor chip 110 is bonded to the substrate 100, the controller 18 first drives the bonding head 14 and the pickup unit 12 to hold the semiconductor chip 110 on the bottom surface of the bonding tool 24 (S10). Subsequently, the controller 18 moves the bonding head 14 such that the bonding tool 24 is in a field of view of the second camera 28, and then the second camera 28 captures an image of the bottom surface of the bonding tool 24 holding the semiconductor chip 110 (S12). Hereinafter, the captured image of the bottom surface of the bonding tool 24 is referred to as a "tool image 40." FIG. 3 is a view showing an example of the tool image 40.

Figure 3:
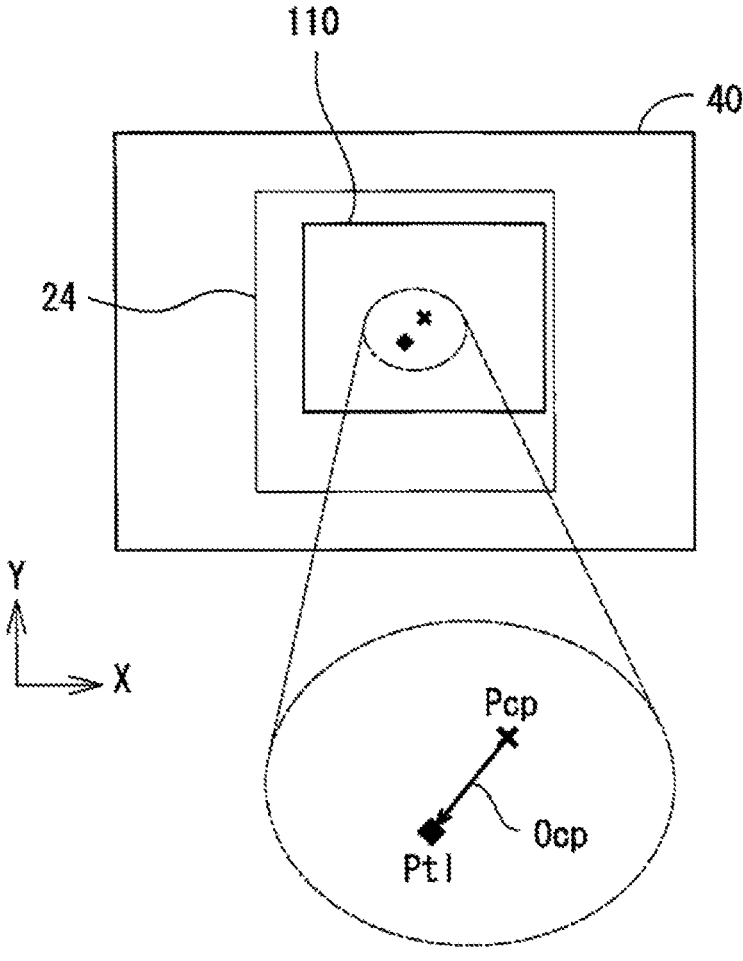
FIG. 3 is a view showing an example of a tool image.

As shown in FIG. 3, the tool image 40 shows the bottom surface of the bonding tool 24 and the semiconductor chip 110 adsorbed and held on the bottom surface. The controller 18 calculates a tilt of the semiconductor chip 110 with respect to an X-axis on the basis of the tool image 40 and rotates the bonding tool 24 around the axis A to correct the tilt (that is, to make a side of the semiconductor chip 110 parallel to the X-axis). Further, the obtained tool image 40 is temporarily stored in the memory of the controller 18.

Figure 4:
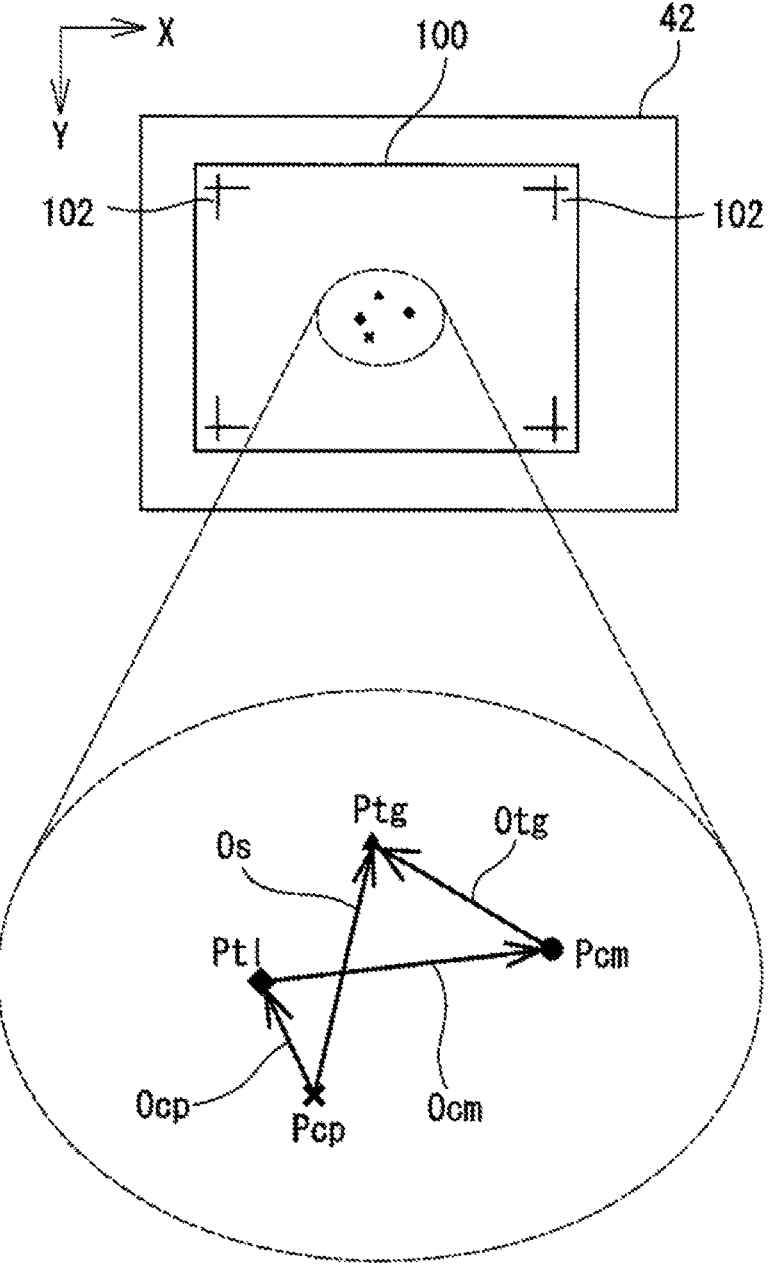
FIG. 4 is a view showing an example of a mounting surface image.

If the tool image 40 is obtained, the controller 18 moves the bonding head 14 upward from the substrate 100 (S14). In that state, the controller 18 drives the first camera 26 to capture an image of the mounting surface (that is, the upper surface of the substrate 100) (S16). Hereinafter, the image obtained by the first camera 26 is referred to as a "mounting surface image 42." FIG. 4 is a view showing an example of the mounting surface image 42.

If the mounting surface image 42 is obtained, the controller 18 calculates a relative positional relationship between the semiconductor chip 110 and a target position Ptg on the basis of the mounting surface image 42, the tool image 40, and the camera offset amount Ocm (S18).

This calculation principle will be described with reference to FIG. 4. For a final offset amount Os which is an offset amount of the target position Ptg with respect to a center Pcp of the semiconductor chip 110, Os=Ocp+Ocm+Otg. Here, Ocp is an offset amount of a central axis Ptl of the bonding tool 24 with respect to the center Pcp of the semiconductor chip 110 (hereinafter referred to as a "chip offset amount Ocp"). This chip offset amount Ocp can be calculated by the tool image 40 being analyzed. Further, Ocm is an offset amount of an optical axis position Pcm of the first camera 26 with respect to the central axis Ptl of the bonding tool 24, that is, the camera offset amount Ocm. This camera offset amount Ocm can be calculated on the basis of the basic camera offset amount Ocm_b stored in advance and the area correction amount C which will be described later.

Further, Otg is an offset amount of the target position Ptg with respect to the optical axis position Pcm of the first camera 26 (hereinafter referred to as a "target offset amount Otg"). This target offset amount Otg can be calculated by the mounting surface image 42 being analyzed. That is, as shown in FIG. 4, usually, the substrate 100 has a substrate side mark 102 as a reference for positioning. In the example illustrated in FIG. 4, the substrate side mark 102 is a cross-shaped mark and is provided near four corners of the substrate 100. The first camera 26 captures an image of the mounting surface at an angle of view including the substrate side mark 102. Therefore, the substrate side mark 102 is included in the mounting surface image 42. The target position Ptg in the mounting surface image 42 can be specified with the substrate side mark 102 as a reference. Further, a center position of the mounting surface image 42 can be regarded as the optical axis position Pcm of the first camera 26. The target offset amount Otg can be obtained from the offset amount of the target position Ptg in the mounting surface image 42 with respect to the center position of the mounting surface image 42 (the optical axis position Pcm of the first camera 26).

If the relative positional relationship between the center Pcp of the semiconductor chip 110 and the target position Ptg, that is, the final offset amount Os, can be calculated, the controller 18 moves the bonding head 14 by the final offset amount Os. As a result, the semiconductor chip 110 held by the bonding tool 24 is located directly above the target position Ptg. In this state, the controller 18 lowers the bonding tool 24 to bond the semiconductor chip 110 to the target position Ptg.

As is clear from the above description, in the present example, the chip offset amount Ocp, the camera offset amount Ocm, and the target offset amount Otg are used for positioning the semiconductor chip 110. In other words, to accurately position the semiconductor chip 110, accurate values of the chip offset amount Ocp, the camera offset amount Ocm, and the target offset amount Otg are required. Here, the accurate values of the chip offset amount Ocp and the target offset amount Otg can be calculated from the tool image 40 and the mounting surface image 42.

On the other hand, it is not possible to find the camera offset amount Ocm from the tool image 40 and the mounting surface image 42, and it is necessary to store an accurate value of the camera offset amount Ocm in advance. Here, as described above, the memory of the controller 18 stores the value of the camera offset amount Ocm in design, that is, the basic camera offset amount Ocm_b. However, an error (hereinafter referred to as a "camera offset error") may occur between the actual camera offset amount Ocm and the basic camera offset amount Ocm_b due to distortion of a drive system of the bonding head 14 and the like.

Figure 5:
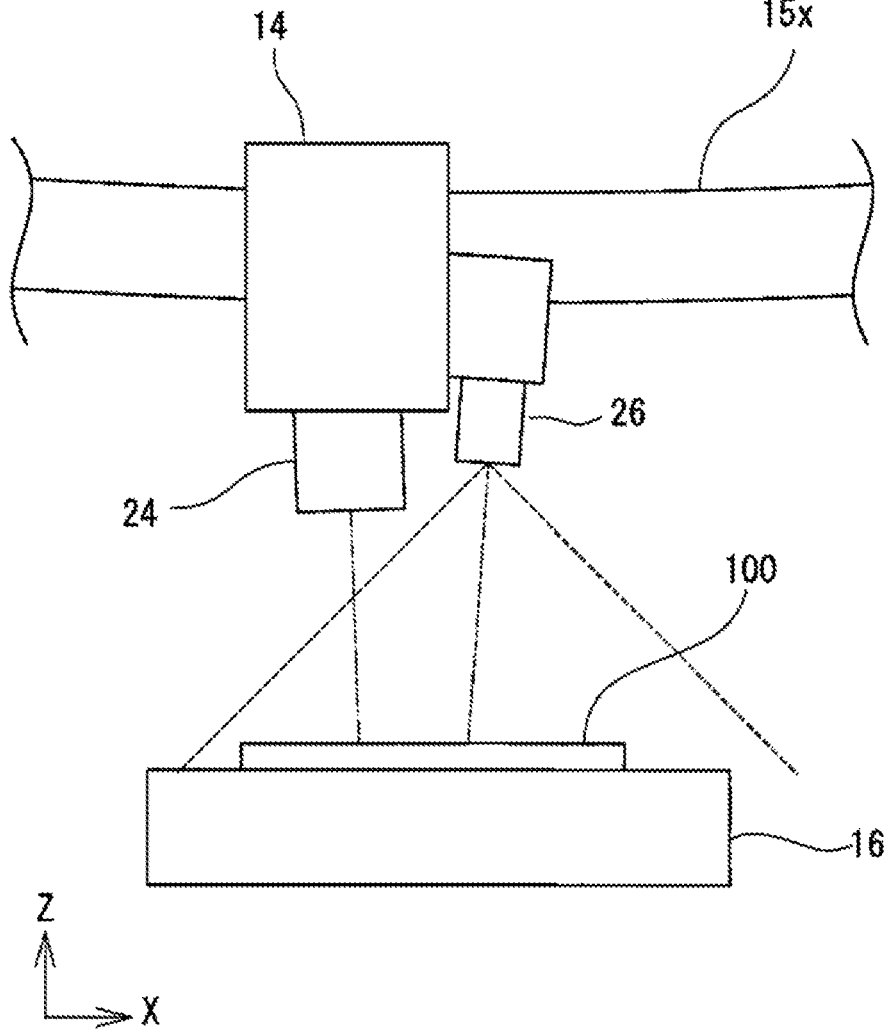
FIG. 5 is a conceptual view showing a state in which a camera offset error occurs.

This will be described with reference to FIG. 5. FIG. 5 is a conceptual view showing a state in which the camera offset error occurs. The drive system of the bonding head 14 may be mechanically distorted. For example, as shown in FIG. 5, bending may occur in an X guide rail 15x that guides the movement of the bonding head 14 in the X direction. In this case, a relative position of the first camera 26 with respect to the bonding tool 24 may change depending on the position of the bonding head 14, and a camera offset error may occur. Further, the optical axis of the first camera 26 or the central axis of the bonding tool 24 may be tilted due to the bending of the X guide rail 15x. In this case, a relative position of the optical axis of the first camera 26 with respect to the central axis of the bonding tool 24 in the mounting surface image 42 changes, and the camera offset error occurs. Such a camera offset error varies depending on the position of the bonding head 14. For example, a bending amount of the X guide rail 15x described above tends to increase as it approaches a center of the X guide rail 15x, and thus the camera offset error also tends to increase as it approaches the center of the X guide rail 15x.

To accurately position the semiconductor chip 110, it is necessary to accurately correct the camera offset error that varies depending on the position of the bonding head 14. Therefore, in the present example, prior to the bonding of the semiconductor chip 110, the area correction amount C for correcting the camera offset error is acquired for each of the plurality of points Pi. The acquisition of this area correction amount C will be described below.

Figure 6:
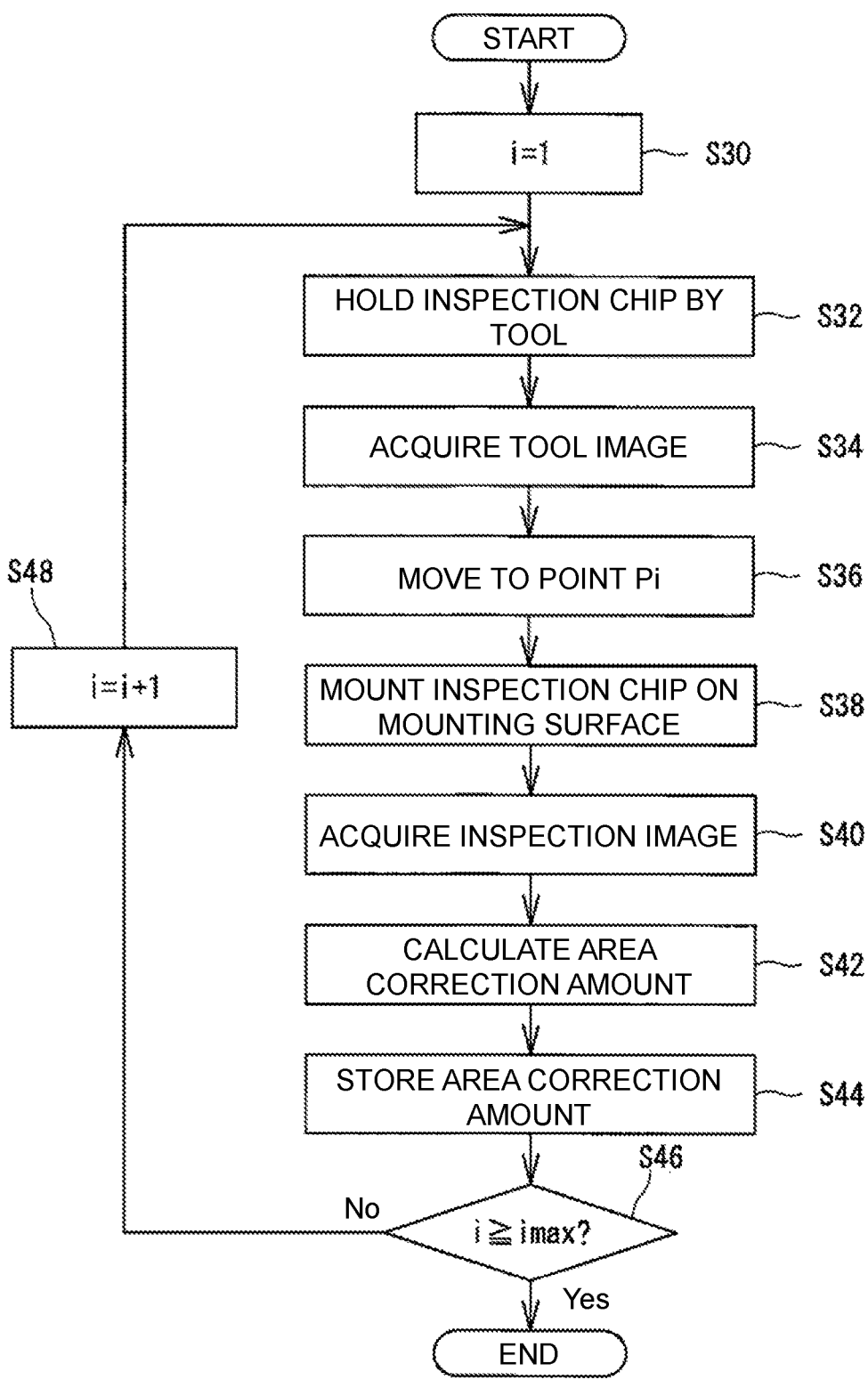
FIG. 6 is a flowchart showing a flow of acquisition of an area correction amount.
Figure 7A:
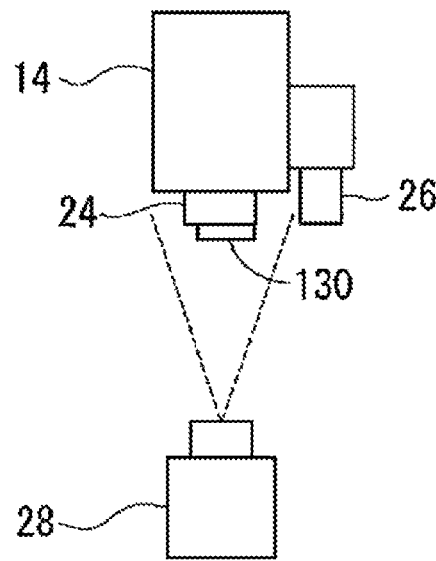
FIG. 7A is a conceptual view showing a flow of acquisition of an area correction amount.
Figure 7B:
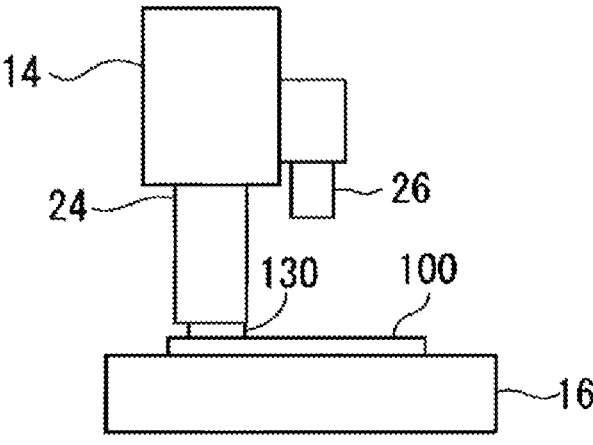
FIG. 7B is a conceptual view showing a flow of acquisition of an area correction amount.
Figure 7C:
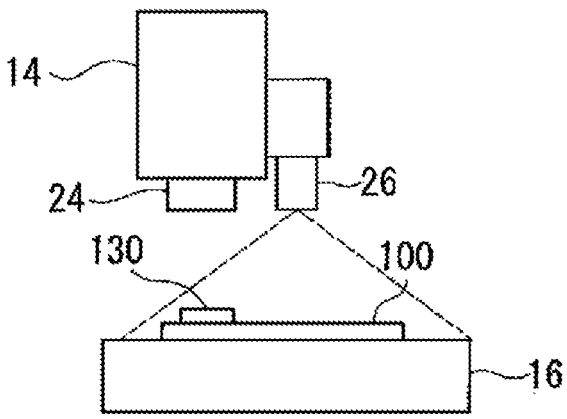
FIG. 7C is a conceptual view showing a flow of acquisition of an area correction amount.

FIG. 6 is a flowchart showing a flow of the acquisition of the area correction amount C. FIGS. 7A to 7C are conceptual views showing the flow of the acquisition of the area correction amount C. The process shown in FIG. 6 is performed prior to bonding the semiconductor chip 110. Further, the memory of the controller 18 stores coordinate values of a plurality of points Pi in advance. The number, a disposition interval, a disposition range, and the like of the plurality of points Pi are not particularly limited. For example, usually, a plurality of target positions is set on one substrate 100, and the semiconductor chips 110 are installed on the plurality of target positions. The plurality of points Pi may be the same as the plurality of target positions.

When the area correction amount C is acquired, the controller 18 first initializes a parameter i and sets i=1 (S30). Subsequently, the controller 18 drives the pickup unit 12 and the bonding head 14 to hold an inspection chip 130 at a tip end of the bonding tool 24 (S32). Here, the inspection chip 130 is not particularly limited as long as it can be handled by the bonding tool 24. Therefore, the inspection chip 130 may be, for example, the semiconductor chip 110 that is actually bonded. Further, the inspection chip 130 may be a dedicated chip specially provided for calculating the area correction amount C. In this case, any alignment mark may be attached to the inspection chip 130.

Next, the controller 18 drives the bonding head 14 and the second camera 28 to acquire the tool image 40 (S34). Specifically, as shown in FIG. 7A, the controller 18 moves the bonding head 14 such that the bonding tool 24 is located directly above the second camera 28, and then causes the second camera 28 to capture an image of the bonding tool 24 and the inspection chip 130 held by the bonding tool 24. In a case in which the inspection chip 130 is tilted with respect to the X-axis, the controller 18 rotates the bonding tool 24 around the axis A to eliminate the tilt. Further, the tool image 40 obtained by this capturing is temporarily stored in the memory of the controller 18.

Next, the controller 18 moves the bonding head 14 to the point Pi (S36). This movement is controlled on the basis of a detection result of a position sensor (for example, an encoder or the like) mounted on the drive system of the bonding head 14. If the bonding head 14 reaches the point Pi, the controller 18 lowers the bonding tool 24 to mount the inspection chip 130 on the mounting surface, as shown in FIG. 7B (S38). Here, as described above, the mounting surface may be the upper surface of the stage 16 or the upper surface of the substrate 100 mounted on the stage 16. In either case, a special alignment mark is not required on the mounting surface. In other words, in the case of the present example, it is not necessary to prepare a dedicated substrate 100 or the like to acquire the area correction amount C.

If the inspection chip 130 can be mounted on the mounting surface, the controller 18 drives the first camera 26 to capture an image of the mounting surface and the inspection chip 130 mounted on the mounting surface, as shown in FIG. 7C (S40). Hereinafter, the captured image of the mounting surface and the inspection chip 130 will be referred to as an "inspection image 44."

Figure 8:
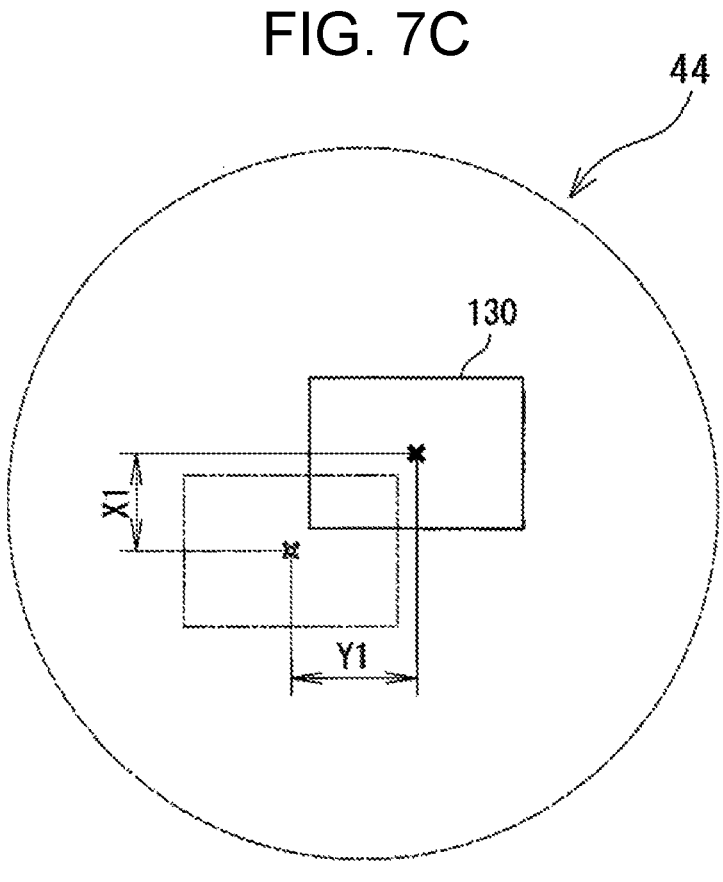
FIG. 8 is a partially enlarged view of an inspection image.

If the inspection image 44 is obtained, the controller 18 calculates the area correction amount C on the basis of the inspection image 44 and the tool image 40 (S42). This will be described with reference to FIG. 8. FIG. 8 is a partially enlarged view of the inspection image 44.

In the present example, the area correction amount C is calculated on the basis of a difference between an actual position and an ideal position of the inspection chip 130 in the inspection image 44. Here, the ideal position of the inspection chip 130 is a position in the inspection image 44 of the inspection chip 130 in a case in which the camera offset amount Ocm is equal to the basic camera offset amount Ocm_b, in other words, in a case in which the camera offset error is zero. In FIG. 8, the actual position of the inspection chip 130 is shown by a solid line, and the ideal position of the inspection chip 130 is shown by a two-dot chain line.

The ideal position is a position deviated from a center of the inspection image 44 (that is, the optical axis of the first camera 26) by L=Ocm_b+Ocp. The basic camera offset amount Ocm_b is stored in advance in the memory, as has been described repeatedly. Further, the chip offset amount Ocp can be obtained from the tool image 40.

Further, the actual position of the inspection chip 130 can be calculated by image analysis of the inspection image 44. For example, in a case in which an alignment mark is attached to the inspection chip 130, the alignment mark is extracted using a technique such as pattern matching, and coordinates of the extracted alignment mark in the inspection image 44 only have to be specified.

If the actual position and the ideal position of the inspection chip 130 in the inspection image 44 can be calculated, the controller 18 calculates the difference between the two and calculates a value that cancels out a value of the difference as the area correction amount C. For example, as shown in FIG. 8, it is assumed that the ideal position of the inspection chip 130 is deviated by (−X1, −Y1) from the actual position of the inspection chip 130. In this case, the controller 18 calculates a value (X1, Y1) for cancelling out this deviation as the area correction amount C. When the semiconductor chip 110 is bonded, a value obtained by adding this area correction amount C to the basic camera offset amount Ocm_b only has to be used as the camera offset amount Ocm.

If the area correction amount C can be calculated, the controller 18 associates the area correction amount C and a current position of the point Pi with each other and stores them in the memory (S44). If the area correction amount C can be calculated for one point Pi, the parameter i is incremented (S46), and then the process returns to step S32. Then, an area correction amount C at a new point Pi is calculated by the same procedure. The inspection chip 130 used to acquire the area correction amount C of the new point Pi may be a chip newly supplied from the pickup unit 12 or an inspection chip 130 already mounted on the mounting surface. Therefore, for example, one inspection chip 130 may be mounted on each of the plurality of points Pi. Further, as another form, a plurality of area correction amounts C may be sequentially acquired while one inspection chip 130 is sequentially mounted on the plurality of points Pi. In any case, if the area correction amount C can be calculated for all the points Pi (that is, if Yes in S46), the process ends.

Here, as is clear from the above description, the error corrected by the area correction amount C is not an error based on an absolute position on the mounting surface, but a camera offset error between the first camera 26 and the bonding tool 24. Therefore, in the present example, even in a case in which the inspection chip 130 is mounted to acquire the area correction amount C, it is not necessary to strictly control a relative position of the inspection chip 130 with respect to the mounting surface. As a result, a complicated procedure for positioning the inspection chip 130 is not necessary, and the area correction amount C can be obtained by a simple procedure.

Further, in calculating the area correction amount C, it is not necessary to strictly control the relative position of the inspection chip 130 with respect to the mounting surface, and thus it is not necessary to attach a special alignment mark or the like to the mounting surface. As a result, it is not necessary to prepare a special mounting surface for calculating the correction amount, and the cost and labor required for acquiring the correction amount can be reduced. Further, in the present example, it is not necessary to capture an image of the bonding tool 24 and the mounting surface at the same time, and thus an expensive two-vertical-field-of-view camera is not necessary and the cost can be further reduced. Further, in the present example, by calculating the area correction amount C for each of the plurality of points Pi and storing the calculated area correction amount C, it is possible to deal with the position-dependent error and further improve the positional accuracy of the bonding.

Figure 9:
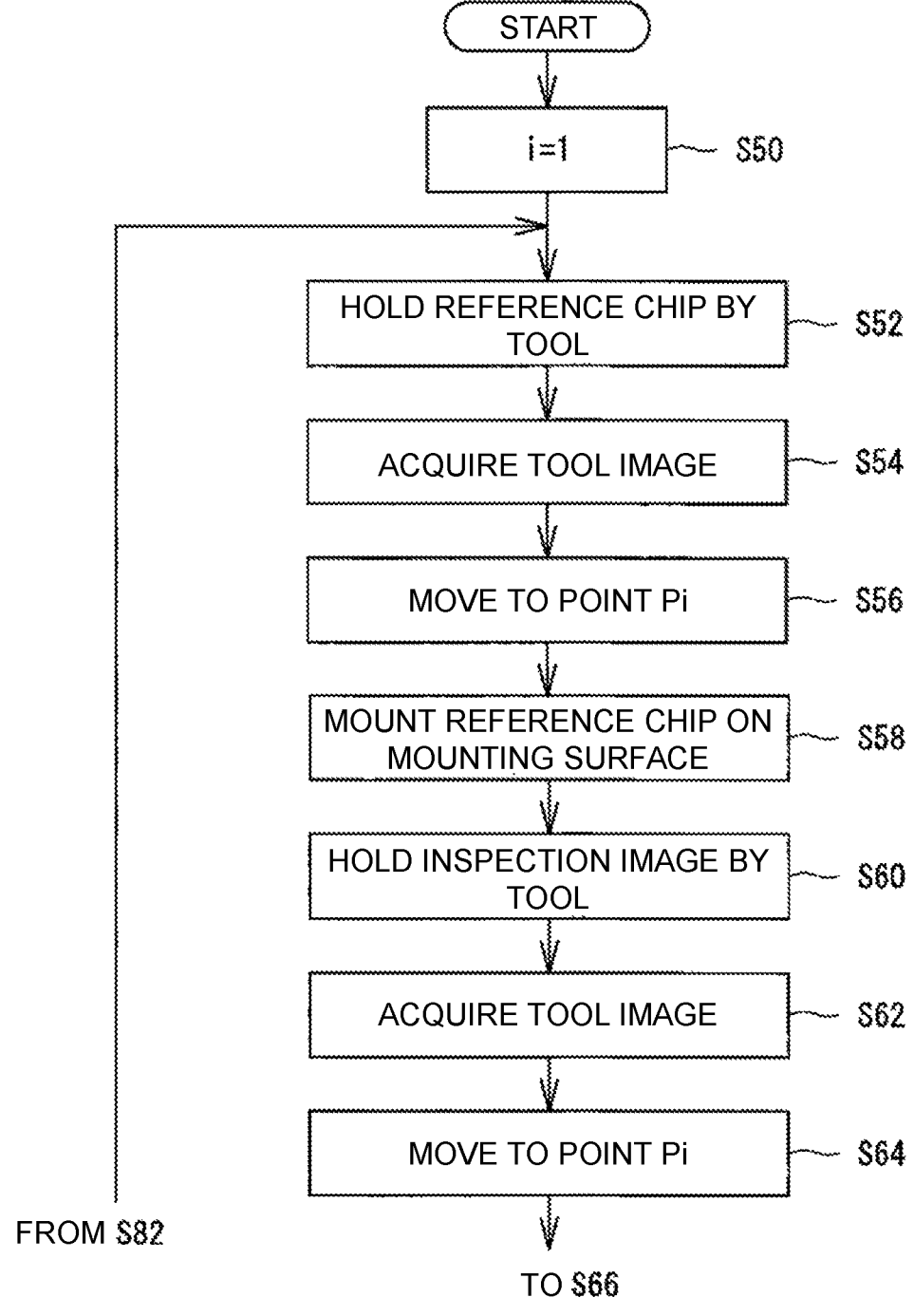
FIG. 9 is a flowchart showing another acquisition procedure of an area correction amount.
Figure 10:
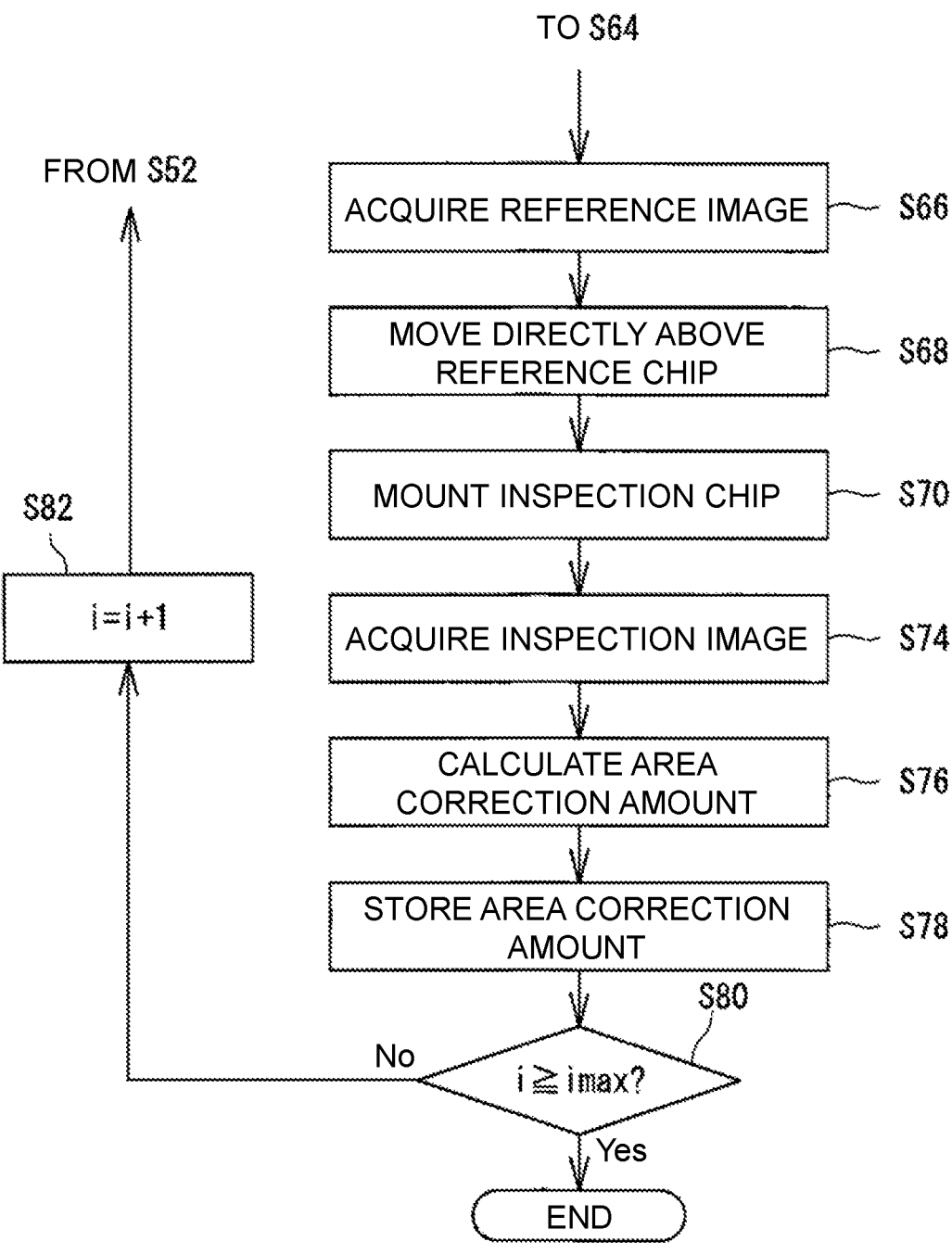
FIG. 10 is a flowchart showing another acquisition procedure of an area correction amount.

Next, another example of the acquisition procedure of the area correction amount C will be described with reference to FIGS. 9 to 13. FIGS. 9 and 10 are flowcharts showing another acquisition procedure of the area correction amount C. FIGS. 11 and 12 are conceptual views showing a state of the acquisition procedure according to the flowcharts of FIGS. 9 and 10. In this example, a reference chip 140 is used in addition to the inspection chip 130 to acquire the area correction amount C. The reference chip 140 is a chip that is mounted on the mounting surface prior to the inspection chip 130 and is used as a positioning target of the inspection chip 130. A shape, size, and the like of the reference chip 140 are not particularly limited. The reference chip 140 may be provided with any alignment mark to make it easier to find a position of the reference chip 140 in image analysis.

The inspection chip 130 is mounted on the reference chip 140. Likewise, a shape, size, and the like of the inspection chip 130 are not particularly limited. However, in a case in which the alignment mark is attached to a surface of the reference chip 140, the inspection chip 130 may be a transparent chip made of a transparent material such as glass, polycarbonate, acrylic, polyester, or transparent ceramic. With such a configuration, the alignment mark of the reference chip 140 can be checked even if the inspection chip 130 is superposed on the reference chip 140. Further, as in the reference chip 140, any alignment mark may be provided on a surface of the inspection chip 130. Further, the inspection chip 130 may have a size smaller than that of the reference chip 140. With such a configuration, even in a case in which the inspection chip 130 is mounted on the reference chip 140 in a state in which the position of the inspection chip 13 is deviated with respect to that of the reference chip 140, the inspection chip 130 is less likely to fall from the reference chip 140.

In a case in which the area correction amount C is acquired, the controller 18 first initializes a parameter i and sets i=1 (S50). Subsequently, the controller 18 drives the bonding head 14 and the pickup unit 12 to hold the reference chip 140 at a tip end of the bonding tool 24 (S52).

Figure 11A:
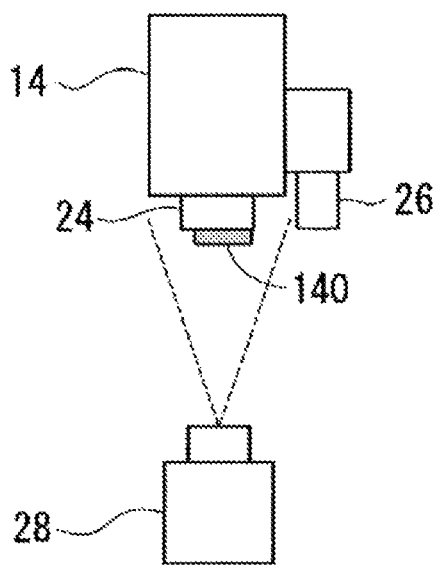
FIG. 11A is a conceptual view showing a state of the acquisition procedure according to the flowcharts of FIGS. 9 and 10.

Next, the controller 18 drives the bonding head 14 and the second camera 28 to acquire the tool image 40 (S54). Specifically, as shown in FIG. 11A, the controller 18 moves the bonding head 14 such that the bonding tool 24 is located directly above the second camera 28, and then causes the second camera 28 to capture an image of the bonding tool 24 and the reference chip 140 held by the bonding tool 24. The controller 18 calculates a tilt of the reference chip 140 with respect to the X-axis on the basis of the tool image 40 and rotates the bonding tool 24 around the axis A to eliminate the tilt.

Figure 11B:
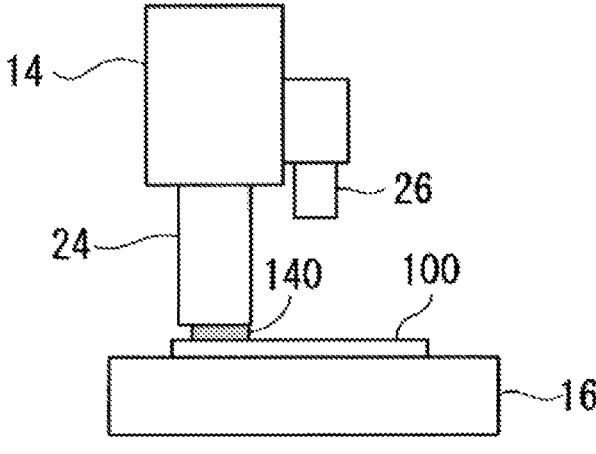
FIG. 11B is a conceptual view showing a state of the acquisition procedure according to the flowcharts of FIGS. 9 and 10.

Next, the controller 18 moves the bonding head 14 to the point Pi (S56). This movement is controlled on the basis of a detection result of a position sensor (for example, an encoder or the like) mounted on the drive system of the bonding head 14. If the bonding head 14 reaches the point Pi, the controller 18 lowers the bonding tool 24 to mount the reference chip 140 on the mounting surface, as shown in FIG. 11B (S58). Here, the mounting surface may be the upper surface of the stage 16 or the upper surface of the substrate 100 mounted on the stage 16.

Figure 11C:
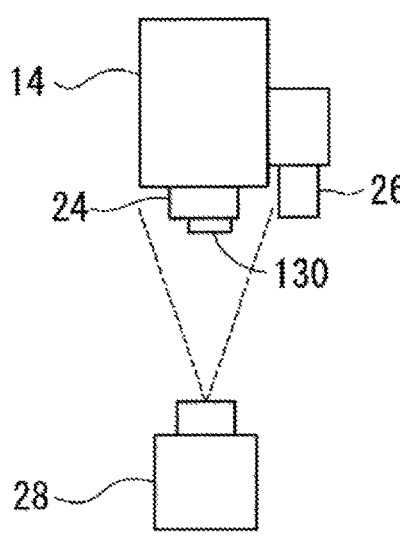
FIG. 11C is a conceptual view showing a state of the acquisition procedure according to the flowcharts of FIGS. 9 and 10.

If the reference chip 140 is mounted on the mounting surface, the controller 18 causes the bonding tool 24 to hold the inspection chip 130 (S60). Then, the controller 18 drives the bonding head 14 and the second camera 28 to acquire the tool image 40 (S62). That is, as shown in FIG. 11C, the controller 18 moves the bonding head 14 such that the bonding tool 24 is located directly above the second camera 28, and then causes the second camera 28 to capture an image of the bonding tool 24 and the inspection chip 130 held by the bonding tool 24. The controller 18 calculates a tilt of the inspection chip 130 with respect to the X-axis on the basis of the tool image 40 and rotates the bonding tool 24 around the axis A to eliminate the tilt. Further, the controller 18 temporarily stores the tool image 40 in the memory.

Figure 12A:
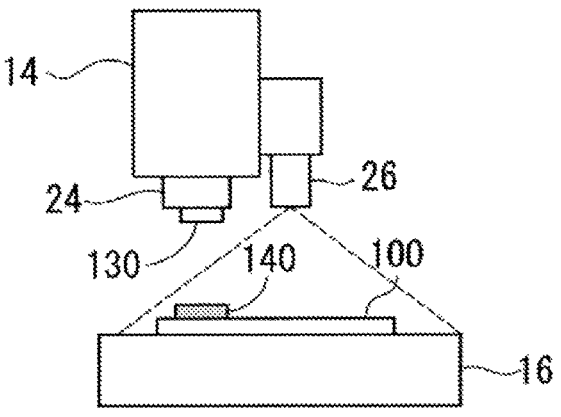
FIG. 12A is a conceptual view showing a state of the acquisition procedure according to the flowcharts of FIGS. 9 and 10.

Subsequently, the controller 18 moves the bonding head 14 to the point Pi (S64) and then causes the first camera 26 to capture an image of the mounting surface on which the reference chip 140 is mounted, as shown in FIG. 12A (S66). Hereinafter, the captured image of the mounting surface on which the reference chip 140 is mounted is referred to as a "reference image." Next, the controller 18 moves the bonding head 14 such that the inspection chip 130 held by the bonding tool 24 is located directly above the reference chip 140 (S68). That is, the controller 18 calculates a relative position between the reference chip 140 mounted on the mounting surface and the inspection chip 130 held by the bonding tool 24 on the basis of the reference image and the tool image 40 acquired in step S62. The procedure for calculating the relative position is the same as the procedure described with reference to FIG. 5, except that a basic camera offset amount Ocm_b is used as a camera offset amount Ocm. That is, the controller 18 calculates a chip offset amount Ocp, which is an offset amount of the bonding tool 24 with respect to the inspection chip 130, on the basis of the tool image 40. Further, the controller 18 calculates a target offset amount Otg, which is an offset amount of a target position (that is, the reference chip 140) with respect to the optical axis of the first camera 26 (that is, the center of the reference image), on the basis of the reference image. Then, the controller 18 calculates, as a final offset amount Os, a value obtained by adding the calculated chip offset amount Ocp, the target offset amount Otg, and the basic camera offset amount Ocm_b to each other. In a case in which an actual camera offset amount Ocm is the same as the basic camera offset amount Ocm_b, the calculated final offset amount Os is an offset amount of the reference chip 140 with respect to the inspection chip 130. Therefore, in a case in which Ocm=Ocm_b, if the bonding head 14 is moved by the final offset amount Os, the inspection chip 130 is located directly above the reference chip 140.

Figure 12B:
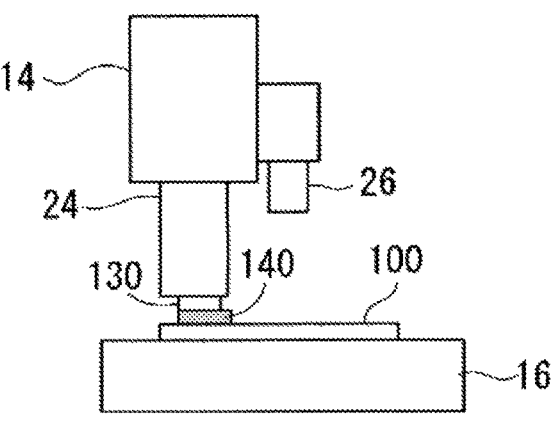
FIG. 12B is a conceptual view showing a state of the acquisition procedure according to the flowcharts of FIGS. 9 and 10.
Figure 12C:
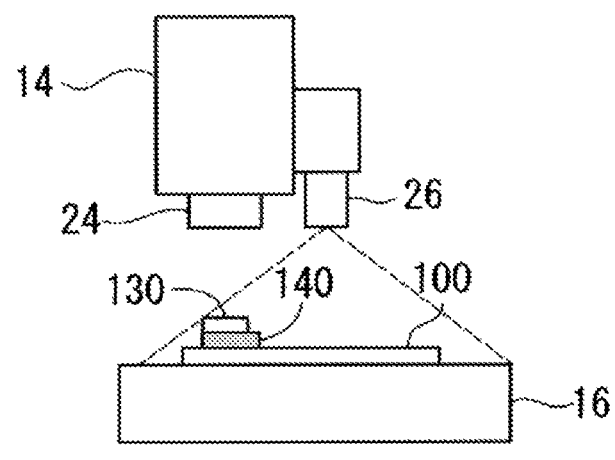
FIG. 12C is a conceptual view showing a state of the acquisition procedure according to the flowcharts of FIGS. 9 and 10.

If the inspection chip 130 is located directly above the reference chip 140, the controller 18 drives the bonding tool 24 to mount the inspection chip 130 on the reference chip 140, as shown in FIG. 12B (S70). Subsequently, as shown in FIG. 12C, the controller 18 causes the first camera 26 to capture an image of the mounting surface and acquires the inspection image 44 (S74).

Figure 13:
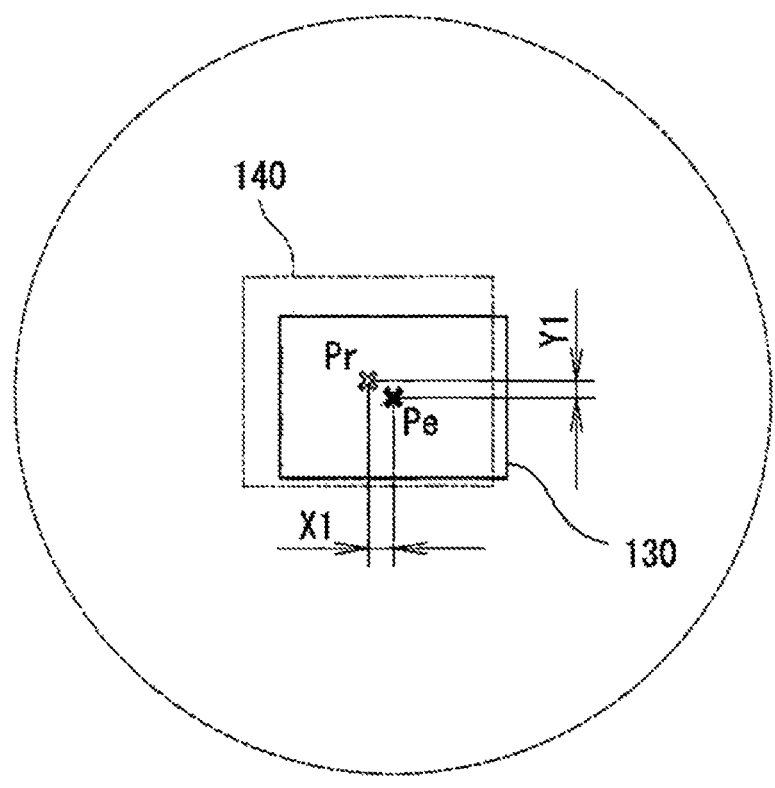
FIG. 13 is a view showing an example of the inspection image.

If the inspection image 44 is obtained, the controller 18 calculates the area correction amount C on the basis of the inspection image 44 (S76). This will be described with reference to FIG. 13. FIG. 13 is a view showing an example of the inspection image 44. In FIG. 13, the reference chip 140 is shown by a two-dot chain line, and the inspection chip 130 is shown by a solid line. In the present example, the area correction amount C is calculated on the basis of a difference between a position of the inspection chip 130 and a position of the reference chip 140 in the inspection image 44. That is, in the present example, the inspection chip 130 is positioned with respect to the reference chip 140 and mounted on the reference chip 140 with Ocm=Ocm_b. Therefore, in a case in which Ocm=Ocm_b, a center Pr (a white x mark) of the reference chip 140 and a center Pe (a black x mark) of the inspection chip 130 should match each other. On the contrary, in a case in which Ocm Ocm_b and an offset error occurs between the two, the inspection chip 130 deviates from the reference chip 140 by the amount of the offset error. Therefore, if the inspection image 44 is analyzed and the deviation amount of the inspection chip 130 with respect to the reference chip 140 is extracted, the area correction amount C for correcting the deviation can be obtained.

In the example of FIG. 13, the inspection chip 130 is deviated from the reference chip 140 by (X1, −Y1). Therefore, in this case, the area correction amount C for correcting the deviation is (−X1, Y1).

If the area correction amount C can be calculated, the controller 18 associates the area correction amount C and a coordinate value of the point Pi with each other and stores them in the memory (S78). If the area correction amount C can be calculated for one point Pi, the parameter i is incremented (S82), and then the process returns to step S52. Then, an area correction amount C at a new point Pi is acquired by the same procedure. The reference chip 140 and the inspection chip 130 used to acquire the area correction amount C of the new point Pi may be chips newly supplied from the pickup unit 12 or an reference chip 140 and an inspection chip 130 already mounted on the mounting surface. If the area correction amount C can be acquired for all the points Pi (that is, if Yes in step S80), the process ends.

Here, as is clear from the above description, in the present example, the reference chip 140 mounted prior to the inspection chip 130 is used as a mounting target position of the inspection chip 130. Therefore, it is not necessary to attach a special alignment mark or the like to the mounting surface. As a result, it is not necessary to prepare a special mounting surface for calculating the correction amount, and the cost and labor required for calculating the correction amount can be reduced. Further, in the present example, instead of a theoretical target position, the reference chip 140 actually mounted on the mounting surface is set as a target position. Therefore, the camera offset error and, furthermore, the area correction amount C can be calculated more accurately.

Further, in the present example, it is not necessary to capture an image of the bonding tool 24 and the mounting surface at the same time, and thus an expensive two-vertical-field-of-view camera is not necessary and the cost can be further reduced. Further, in the present example, by calculating the area correction amount C for each of the plurality of points Pi and storing the calculated area correction amount C, it is possible to deal with the position-dependent error and further improve the positional accuracy of the bonding.

What is claimed is:

1. An apparatus for producing a semiconductor device comprising:

a stage on which a substrate is mounted;

a bonding head capable of moving to at least one of discretionary points relative to the stage;

a position detecting means for detecting a position of the bonding head;

a bonding tool that is attached to the bonding head and holds a chip;

a first camera that is attached to the bonding head and captures an image of a mounting surface, which is an upper surface of the stage or an upper surface of the substrate mounted on the stage, from above; and a controller, wherein the controller is configured to execute for each of one or more of the discretionary points:

a mounting process of mounting the chip on the mounting surface by moving the bonding head to the discretionary points and then driving the bonding tool;

an inspection image acquisition process of acquiring, as an inspection image, an image of the mounting surface after the chip has been mounted thereon captured by the first camera;

a correction amount calculation process of calculating, as an area correction amount, a correction amount for a camera offset amount, which is an offset amount of the first camera with respect to the bonding tool, on a basis of a position of the chip in the inspection image; and a storage process of associating the calculated area correction amount and a position of the discretionary points detected by the position detecting means and then storing the associated information in a storage device, wherein, in the correction amount calculation process, the controller calculates the area correction amount on a basis of a difference between an actual position of the chip in the inspection image and an ideal position of the chip, which is obtained from the camera offset amount in design, in the inspection image.

2. The apparatus for producing a semiconductor device according to claim 1, further comprising:

a second camera that captures an image of the bonding tool from below, wherein the controller is configured to execute a tool image acquisition process of acquiring, as a tool image, an image of the chip held by the bonding tool, which is captured by the second camera, prior to the mounting process, and wherein the controller calculates a chip offset amount which is an offset amount of a center of the bonding tool with respect to a center of the chip on a basis of the tool image, and calculates the ideal position of the chip in the inspection image on a basis of the chip offset amount and the camera offset amount in design.

3. The apparatus for producing a semiconductor device according to claim 2, wherein, after the mounting process is executed, the controller executes the inspection image acquisition process without moving the bonding head horizontally.

4. The apparatus for producing a semiconductor device according to claim 2, wherein the position detecting means includes a position sensor installed in a drive system of the bonding head.

5. The apparatus for producing a semiconductor device according to claim 1, wherein, after the mounting process is executed, the controller executes the inspection image acquisition process without moving the bonding head horizontally.

6. The apparatus for producing a semiconductor device according to claim 5, wherein the position detecting means includes a position sensor installed in a drive system of the bonding head.

7. The apparatus for producing a semiconductor device according to claim 1, wherein the position detecting means includes a position sensor installed in a drive system of the bonding head.

8. An apparatus for producing a semiconductor device comprising:

a stage on which a substrate is mounted;

a bonding head capable of moving at least one of discretionary points relative to the stage;

a bonding tool that is attached to the bonding head and bonds a chip to the substrate;

a first camera that is attached to the bonding head and captures an image of a mounting surface, which is an upper surface of the stage or an upper surface of the substrate mounted on the stage, from above; and a controller, wherein the controller is configured to execute for each of one or more of the discretionary points:

a first mounting process of mounting a reference chip on the mounting surface by moving the bonding head to the discretionary points and then driving the bonding tool;

a reference image acquisition process of acquiring, as a reference image, an image of the mounting surface after the reference chip has been mounted thereon captured by the first camera;

a second mounting process of mounting an inspection chip on the reference chip by positioning the bonding head on a basis of the reference image such that the inspection chip is allowed to be mounted directly above the reference chip and then driving the bonding tool;

an inspection image acquisition process of acquiring, as an inspection image, an image of the mounting surface after the inspection chip has been mounted thereon captured by the first camera;

a correction amount calculation process of calculating, as an area correction amount, a correction amount for a camera offset amount, which is an offset amount of the first camera with respect to the bonding tool, on a basis of a positional deviation between the reference chip and the inspection chip in the inspection image; and a storage process of associating the calculated area correction amount and a position of the discretionary points and then storing the associated information in a storage device.

* * * * *